(12) United States Patent
Bai et al.

(10) Patent No.: US 8,606,107 B2
(45) Date of Patent: *Dec. 10, 2013

(54) COLORLESS DENSE WAVELENGTH DIVISION MULTIPLEXING TRANSMITTERS

(75) Inventors: Yu Sheng Bai, Los Altos Hills, CA (US); Yang Jing Wen, Cupertino, CA (US)

(73) Assignee: Futurewei Technologies, Inc., Plano, TX (US)

( * ) Notice: Subject to any disclaimer, the term of this patent is extended or adjusted under 35 U.S.C. 154(b) by 182 days.

This patent is subject to a terminal disclaimer.

(21) Appl. No.: 13/310,482

(22) Filed: Dec. 2, 2011

(65) Prior Publication Data

US 2012/0141128 A1 Jun. 7, 2012

Related U.S. Application Data

(60) Provisional application No. 61/419,562, filed on Dec. 3, 2010.

(51) Int. Cl.
*H04J 14/02* (2006.01)
(52) U.S. Cl.
USPC ............................................. 398/70; 398/91
(58) Field of Classification Search
USPC ........................................ 398/68–73, 91–95
See application file for complete search history.

(56) References Cited

U.S. PATENT DOCUMENTS

| | | | |
|---|---|---|---|
| 6,396,603 B1 | 5/2002 | Kim | |
| 7,149,431 B2 | 12/2006 | Jung et al. | |
| 7,167,649 B2 | 1/2007 | Song et al. | |
| 7,295,778 B2 | 11/2007 | Lee et al. | |
| 2004/0042794 A1 | 3/2004 | Kim et al. | |
| 2006/0083515 A1 | 4/2006 | Hann et al. | |
| 2008/0031626 A1 | 2/2008 | Welch et al. | |
| 2008/0080866 A1 | 4/2008 | Bai | |
| 2008/0279557 A1 | 11/2008 | Park et al. | |
| 2010/0316378 A1* | 12/2010 | Yeh et al. | 398/58 |
| 2011/0038635 A1 | 2/2011 | Bai | |
| 2011/0129227 A1 | 6/2011 | Wen et al. | |

OTHER PUBLICATIONS

Wong, et al, "Directly-Modulated Self-Seeding Reflective SOAs as Colorless Transmitters for WDM Passive Optical Networks," Optical Society of America, PDP49, 2006, 3 pages.

Foreign communication from a counterpart application, PCT application PCT/US2011/063138, International Search Report dated Feb. 29, 2012, 5 pages.

Foreign communication from a counterpart application, PCT application PCT/US2011/063138, Written Opinion dated Feb. 29, 2012, 7 pages.

(Continued)

*Primary Examiner* — Leslie Pascal
(74) *Attorney, Agent, or Firm* — Conley Rose, P.C.; Grant Rodolph; Brandt D. Howell (57) ABSTRACT

A dense wavelength-division-multiplexing (DWDM) system, comprising a plurality of laser transmitters, a wavelength division multiplexer (WDM) optically coupled to the laser transmitters and to an output optical transmission media, a coupler optically coupled to the output optical transmission media, an interferometric filter optically coupled to the coupler but not directly to the output optical transmission media, and a light reflector optically coupled to the interferometric filter and not directly to the output optical transmission media.

24 Claims, 7 Drawing Sheets

(56) References Cited

OTHER PUBLICATIONS

Xu, et al., "10-Gb/s Carrier-Reuse WDM-PON Based on Injection Locked FP-LDs," Joint Conference of the Opto-Electronics and Communications Conference (OECC) and the Australian Conference on Optical Fibre Technology (ACOFT), IEEE, Jul. 7, 2008, pp. 1-2.

Giles, et al., "Fiber-Grating Sensor for Wavelength Tracking in Single-Fiber WDM Access PON's," IEEE Photonics Technology Letters, IEEE Service Center, vol. 9, No. 4, Apr. 1, 1997.

* cited by examiner

COLORLESS DENSE WAVELENGTH DIVISION MULTIPLEXING TRANSMITTERS

CROSS-REFERENCE TO RELATED APPLICATIONS

The present application claims the benefit of U.S. Provisional Patent Application No. 61/419,562 filed Dec. 3, 2010 by Yu Sheng Bai et al. and entitled "Colorless Dense Wavelength Division Multiplexing Transmitters with Improved Performance and Reduced Cost," which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Optical transmission systems constitute the basic carrier for most telecommunication systems. Many optical transmission technologies are based on the principle of wavelength division multiplexing (WDM) or Dense WDM (DWDM), where the transmission channels are carried by optical signals over different wavelengths or different bands of wavelengths. In some WDM or DWDM systems, it is desirable to use a colorless WDM or DWDM transmitter that uses a plurality of colorless laser transmitters to provide a plurality of different wavelength channels. The colorless WDM or DWDM transmitter comprises a plurality of filters that have different bandpass spectra configured to select different wavelength bands from the colorless laser transmitters to provide the different wavelength channels. Similar or identical laser transmitters can be used to provide the different wavelengths. Different types of laser transmitters can also be used without changing the wavelength channels.

SUMMARY

In one embodiment, the disclosure includes a dense wavelength-division-multiplexing (DWDM) system, comprising a plurality of laser transmitters, a wavelength division multiplexer (WDM) optically coupled to the laser transmitters and to an output optical transmission media, a coupler optically coupled to the output optical transmission media, an interferometric filter optically coupled to the coupler but not directly to the output optical transmission media, and a light reflector optically coupled to the interferometric filter and not directly to the output optical transmission media.

In another embodiment, the disclosure includes a method implemented by a colorless wavelength division multiplexer (WDM) laser transmitter apparatus comprising transmitting a plurality of optical channels using a plurality of colorless laser transmitters, combining and sending the optical channels into a single output optical transmission media, splitting a feedback portion of the combined channels, and narrowing the linewidth of the feedback portion using an interferometric filter.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

For WDM or DWDM transmission systems, reducing the cost of wavelength specific transmitters has been important for practical implementation. Self-seeding Fabry-Perot laser diodes (FPLDs) and reflective semiconductor optical amplifiers (RSOAs) are two promising schemes for achieving cost-effective colorless WDM light sources, since such schemes may eliminate the requirement of using seeding light. The use of self-seeded RSOAs as transmitters in WDM passive optical networks (PONs) was proposed in U.S. Pat. No. 7,295,778 by J. H. Lee et al., entitled "Wavelength division multiplexed passive optical network system," and U.S. Patent Publication No. 2008/0279557 by C. S. Park et al., entitled "WDM-PON using self-injection locking, optical line terminal thereof, and data transmission method," both of which are incorporated herein by reference. In the proposed schemes, a reflective type fiber Bragg grating (FBG) was used as reflector and wavelength selector. An improved structure was proposed by E. Wong, et al., in a publication entitled "Directly-modulated self-seeding reflective SOAs as colorless transmitters for WDM passive optical networks", in Optical Fiber Communication Conference (OFC) 2006, Post-deadline Paper (PDP)-49, 2006, which is incorporated herein by reference. This scheme proposes replacing the gratings with a shared arrayed waveguide grating (AWG) and reflector, which are both located at a remote node. Further, an optical circulator was used as a reflector and mode selection was realized by the AWG. The use of self-seeded FPLDs as a low-cost light source has been proposed in U.S. Patent Publication No. 2008/0279557 and in U.S. Patent Publication No. 2006/0083515 by S. Hann et al., entitled "WDM-PON having optical source of self-injection locked Fabry-Perot laser diode," which is incorporated herein by reference. In such schemes, a fiber Bragg grating (FBG) with specific wavelength was used for each optical network unit (ONU) as a reflector and wavelength selector. An improved scheme is presented in U.S. Pat. No. 7,167,649 by J. W. Song et al., entitled "Dense wavelength division multiplexing-passive optical network system utilizing self-injection locking of Fabry-Perot laser diodes," which is incorporated herein by reference. This improved scheme replaces the FBG for each ONU with a shared WDM multiplexer and reflector. The wavelength selection was realized by the corresponding passband of the multiplexer of AWG type. Another scheme is proposed in U.S. Pat. No. 7,149,431 by D. K. Jung, entitled "Self-seeded Fabry-Perot laser device for wavelength division multiplexing system," which is incorporated herein by reference. This scheme uses a shared WDM multiplexer for wavelength selection, while the reflector is based on a circulator with an optical feedback loop.

The schemes proposed above for self-seeding FPLDs and polarization sensitive RSOAs may have different drawbacks and may all suffer from polarization issues where the polarization of the feedback light requires alignment with that of the light inside the FPLD or RSOA. The polarization variation of the reflected light is random and difficult to track, which makes the schemes above difficult to realize in practical implementation.

Another scheme has been proposed for generating multiple channel WDM signals using multiple single type (colorless) transmitters as proposed in U.S. Patent Application Publication No. 2011/0038635 filed Nov. 17, 2009 by Yu Sheng Bai et al. and entitled "Colorless Dense Wavelength Division Multiplexing Transmitters," which is incorporated herein by reference as if reproduced in its entirety. A scheme to stabilize and lock the wavelengths of the colorless DWDM transmitters of U.S. Patent Application Publication No. 2011/0038635 was proposed in U.S. Patent Application Publication No. 2011/0129227 by Y. J. Wen et al., entitled "Wavelength stabilization and locking for colorless dense wavelength division multiplexing transmitters," which is incorporated herein by reference as if reproduced in its entirety.

Figure 1:
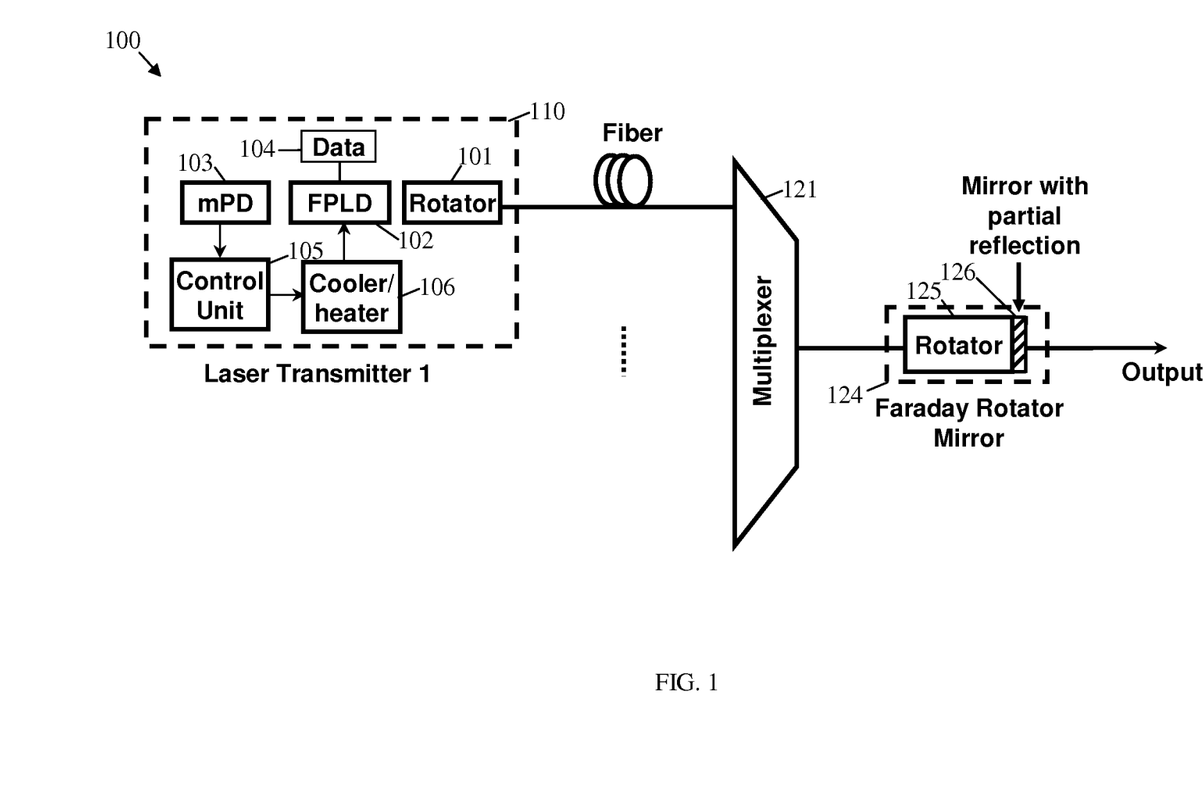
FIG. 1 is a schematic diagram of a colorless WDM transmitter configuration.

FIG. 1 illustrates an embodiment of a colorless WDM transmitter configuration similar to the scheme of U.S. Patent Application Publication No. 2011/0129227, which uses a built-in mPD (e.g., mPD 103) to detect the backward light of the corresponding FPLD and uses the corresponding photocurrent (in the mPD) to control the laser temperature to stabilize and lock the oscillated wavelength. The colorless WDM transmitter scheme 100 may comprise a plurality of laser transmitters 110 (e.g., at different ONUs), a multiplexer 121 coupled to the laser transmitters 110, and a Faraday Rotator Minor (FRM) 124 coupled to the multiplexer 121. The laser transmitters 110 may be configured to transmit similar or the same wavelengths or wavelength bandwidths. For instance, the laser transmitters 110 may have the same design.

Each laser transmitter 110 may comprise a rotator 101 (e.g., a 45 or −45 degrees Faraday rotator) coupled to a FPLD 102 (or RSOA). The FPLD 102 may be coupled to a data unit 104 and a cooler/heater 106. Additionally, the FPLD 102 may be coupled to a monitoring photodetector (mPD) 103 and a control unit 105 that may be positioned between the mPD 103 and the cooler/heater 106. The rotator 101, FPLD 102, mPD 103, data unit 104, control unit 105, and cooler/heater 106 may be arranged as shown in FIG. 1 and may be packaged in a single casing for each laser transmitter 110.

The rotator 101 may be configured to rotate light polarization to about 45 degrees from the output of the FPLD 102. The rotated polarized light may be sent via a fiber to the multiplexer 121. The data from data unit 104 may be sent to the FPLD 102 for direct modulation. The mPD 103 may detect an output signal from the FPLD 102, which may be analyzed to monitor the output wavelength or frequency of the FPLD 102. The detected output frequency may be monitored by the control unit 105, which may be configured to control (via signaling) the cooler/heater 106 to properly align the wavelength/frequency of the FPLD 102. The cooler/heater 106 may be controlled to control the temperature of the FPLD 102 and thus adjust its output wavelength/frequency.

The multiplexer 121 may provide wavelength selection for the transmitted optical signals from the laser transmitters 110, and hence provide wavelength channels from the laser transmitters 110. The multiplexer 121 may also combine all the wavelength channels and send the combined wavelength channels via a single fiber. The FRM 124 may be coupled to the downstream fiber and may comprise a second rotator 125 (e.g., a 45 or −45 degrees Faraday rotator) coupled to a minor 126, as shown in FIG. 1. The second rotator 125 may rotate the polarization of reflected light from the mirror 126 to align the polarized light with the rotated polarized light from the rotator 101. The light from the multiplexer 121 may be reflected and aligned by the FRM 124 to provide self-seeding light to the FPLD 102. The polarization dependence of the transported light in the fiber may be eliminated in the scheme 100 through the combination of the Faraday rotator 101 built in the laser transmitter 110 and the FRM 124.

In the schemes in U.S. patent application Ser. No. 12/619,717 and U.S. Patent Application Publication No. 20110129227, a WDM multiplexer is used for wavelength selection. Typically, a WDM multiplexer has relatively wide pass-band, e.g., up to more than 0.4 nanometer (nm). Such a relatively large bandwidth may provide limited spectral confinement for the oscillated chip cavity mode in the laser transmitter. This would lead to broader linewidth of the self-seed laser output and relatively poor transmission performance for a directly modulated signal. Further, a broad filter bandwidth (in the multiplexer) may lead to high requirement for the round trip loss of the external cavity (between the FPLD and the FRM). In some cases, the bandwidth of the multiplexer may be made sufficiently narrow, e.g., as narrow as about 0.1 nm. However, the directly modulated light may have a relatively broad spectrum and this narrow filter bandwidth may induce a strong filtering effect for the transmitter output and degrade the signal quality.

Disclosed herein is a system, apparatus, and method for improving the performance of colorless WDM or DWDM transmitters based on self-seeded FPLDs or RSOAs. The system and method comprise using an interferometric filter between a multiplexer and a light reflector to better confine the spectral linewidth. Additionally, a coupler may be positioned between the multiplexer and the interferometric filter to allow the output light from a FPLD or RSOA to bypass the interferometric filter. This scheme may allow narrowing the spectral linewidth without causing the output light to suffer from substantial filtering effect. Further, the apparatus and method may integrate a plurality of laser transmitters with the multiplexer, which may eliminate the individual packaging requirement of lasers and allow using a single rotator. Integrating or packaging the lasers with the multiplexer may also reduce colorless WDM transmitter system cost. This scheme may also allow using lower cost WDM or DWDM transmitters, e.g., in comparison to other laser transmitters that require using a seeding light source.

Although described primarily with reference to optical fibers, those of ordinary skill in the art will recognize that the apparatuses and methods of this disclosure are not limited to optical fibers, but may utilize other optical transmission media, such as other types of optical waveguides, as well.

Figure 2:
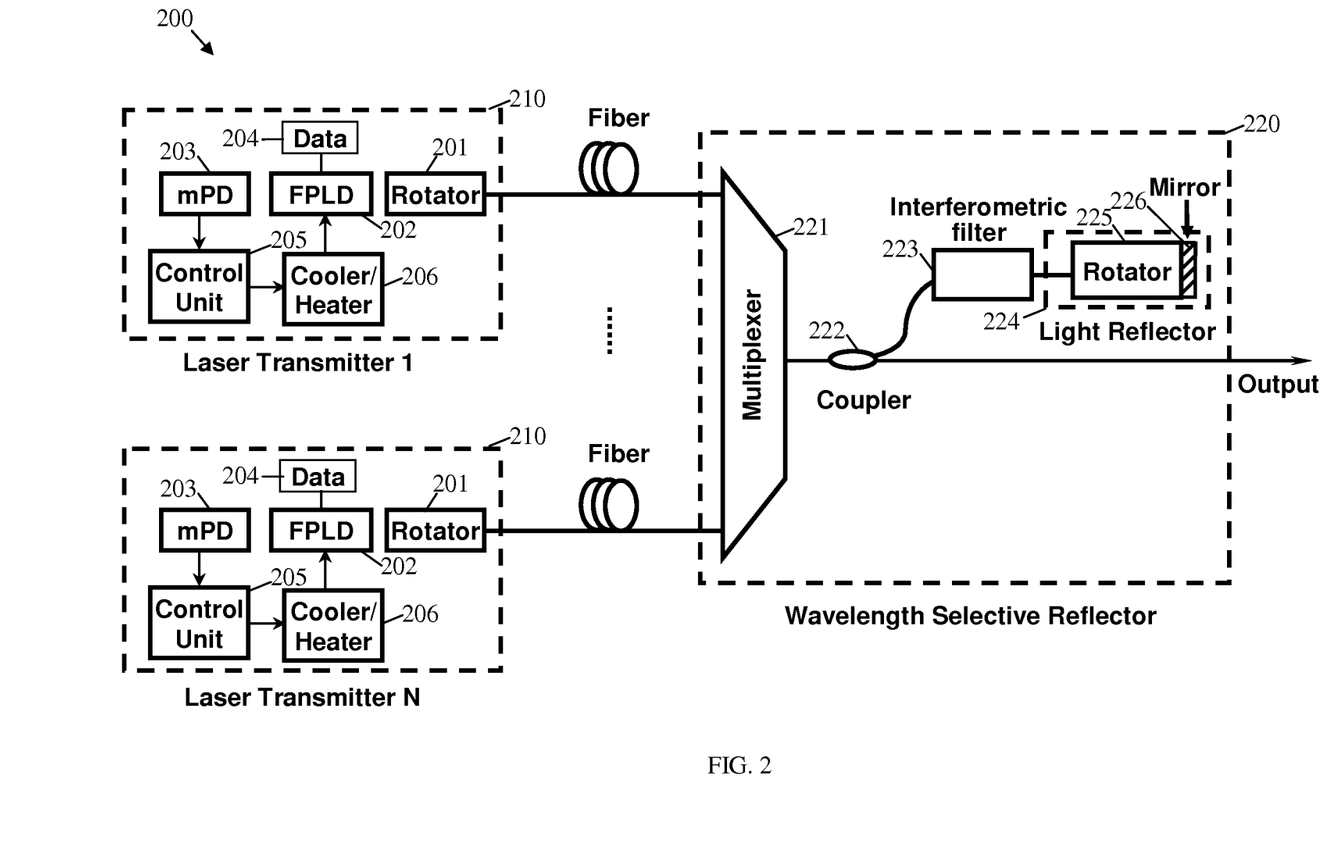
FIG. 2 is a schematic diagram of an embodiment of an improved colorless WDM transmitter configuration.

FIG. 2 illustrates an embodiment of an improved colorless WDM (or DWDM) transmitter configuration 200, which may allow narrowing the spectral linewidth of the transmitted light without introducing substantial optical filtering effect. The colorless WDM transmitter configuration 200 may comprise a plurality of laser transmitters 210 and a wavelength selective reflector 220 coupled to the laser transmitters 210 via a plurality of corresponding fibers. The laser transmitters 210 may be colorless transmitters configured to transmit similar or the same wavelengths or wavelength bandwidths. Each laser transmitter 210 may comprise a rotator 201 (e.g., a 45 or −45 degrees Faraday rotator) coupled to a laser 202 (e.g., a FPLD or RSOA). The laser 202 may be coupled to a data unit 204 and a cooler/heater 206. The laser transmitter 210 may also comprise a detector 203 (e.g., mPD) coupled to the laser 202, and a control unit 205 positioned between the detector 203 and the cooler/heater 206. In some embodiments, the laser 202 and the rotator 201 may be coupled using at least one lens (not shown) positioned between the two components. Similarly, the laser 202 and the detector 203 may be coupled using one or more lenses (not shown) position between the two components. The rotator 201, laser 202, detector 203, data unit 204, control unit 205, and cooler/heater 206 may be arranged as shown in FIG. 2 and may be packaged in a single casing for each laser transmitter 210.

The rotator 201 may be a Faraday rotator configured to rotate the polarization of light incoming from one side by about 45 or about −45 degrees and transmit the rotated light at the opposite side. The Faraday rotator may provide a light from any of the two sides that may be rotated by about 45 or about −45 degrees with respect to the other side. Thus, a light that passes through the Faraday rotator twice, such as a reflected light in a round-trip path, may be rotated by about 90 or about −90 degrees by the Faraday rotator. In some embodiments, a polarizer (not shown) may be positioned between the rotator 201 and the laser 202. The polarizer may be configured to transmit a portion of the light that may be polarized similar to the light in the laser 202. The undesired light polarizations, such as for stray reflections introduced by the fiber connectors, slices in the fiber, or return loss of components inside the cavity may be suppressed by the polarizer.

The laser 202 may be a FPLD that comprises a laser chip (e.g. laser gain chip), which may have a back reflection facet and a front reflection facet on opposite sides. The back reflection facet may be on the side facing the detector 203 and the front reflection facet may be on the side facing the rotator 201. The back reflection facet may be coated with a substantially high-reflection (HR) coating that reflects the light emitted by the laser chip. The front reflection facet may be coated with an anti-reflection (AR) coating and reflect the light in the opposite direction of the back reflection facet. Alternatively, the laser 202 may be a RSOA that comprises only a back reflection facet or additionally a front reflection facet that has a substantially smaller reflection than the corresponding reflection facet of the FPLD. As such, the optical gain in the cavity of the RSOA may have weaker periodical dependence to wavelength in comparison to the FPLD. In the case of ROSA, the cooler/heater 206 may not be necessary and the ROSA may be operated without temperature control.

The detector 203 may be a photodetector, e.g. a photodiode. The detector 203 may receive the backward light transmitted from the back reflection facet and convert the detected light intensity into a detected photocurrent. The detected photocurrent may be correlated to a shift between the oscillation wavelength of the laser and a corresponding transmission peak of the combined filter (combined multiplexer with interferometric filter). This shift may be sent to the control unit 205 to control the cooler/heater 206 and stabilize the output wavelength of the laser 202.

The wavelength selective reflector 220 may comprise a multiplexer 221 coupled to the laser transmitters 210, a coupler 222 coupled to the multiplexer 221, a light reflector 224 coupled to the coupler 222, and an interferometric filter 223 positioned between the coupler 222 and the light reflector 224. The coupler 222 may be coupled to the multiplexer 221 via an output fiber coupled to a single port of the multiplexer 221. As shown in FIG. 2, the interferometric filter 223 and the light reflector 224 may be coupled via the coupler 222 to the multiplexer 221 in parallel to the output fiber. Thus, the lightpath between the coupler 222 and the light reflector 224 may be separated from the lightpath from the coupler 222 and down onto the output fiber.

The multiplexer 221 may be an AWG or a multi-channel thin-film filter configured to combine a plurality of light waves from the laser transmitters 210 into a combined light wave that propagates into the coupler 222. The multiplexer 221 may also filter the light waves that correspond to different laser transmitters 210 at different wavelengths. Each laser 202 may be configured to transmit light at a single mode and a single wavelength (or wavelength range), which may substantially overlap with a transmission peak of the multiplexer 221. Typically, the mode spacing in the laser chip cavity of the laser 202 may be greater than about 100 Gigahertz (GHz) and the combination of the multiplexer 221 and the interferometric filter 223 may have a bandwidth that is substantially less than the mode spacing. Accordingly, the combined light from the multiplexer 221 may comprise a plurality of distinct wavelength channels. In other embodiments, the multiplexer 221 may be an optical interleaver, a fiber Bragg grating multiplexer, an optical add-drop multiplexer (OADM), a reconfigurable OADM (ROADM), or any type of WDM filter. Additionally, the multiplexer 221 may be configured to demultiplex (separate) the reflected light from the light reflector 224 into a plurality of light waves or channels and forward each channel to a corresponding laser transmitter 210. The different wavelengths may be used for seeding the corresponding lasers 202.

The coupler 222 may be a fiber coupler, which separates light into two parts. One part (at an output port) may provide the output of the laser transmitters 210 (on the output fiber from the multiplexer 221). The other part (at a feedback port) may be coupled into the interferometric filter 223. The coupling ratio between the output port and the feedback port may not need to be pre-defined. A higher ratio to the feedback port may provide lower round trip cavity loss and stronger reflected light back to the laser transmitter 210, which may facilitate the self-seeding and lead to better transmitter performance as well as a larger temperature operation window. However higher ratio to the output port may provide higher optical output power for the laser transmitters 210, with improved link budget. In other embodiments, the coupler 222 may be a free-space type coupler or any type of optical power splitter or combiner.

The interferometric filter 223 may be coupled to the feedback port of the coupler 222 at one side and to the light reflector 224 at the other side. The interferometric filter 223 may be a Fabry-Perot etalon that has an about a 3 decibel (dB) bandwidth narrower than that of the multiplexer 221. The interferometric filter 223 may confine the spectral linewidth of the mode selected by the multiplexer 221 and improve the spectral purity and the transmission performance of the laser transmitters 210. The interferometric filter 223 may have a periodic transmission spectrum, which may cover the wavelength band of the multiplexer 221. The pass-band peaks of the multiplexer 221 may match in wavelength with the corresponding transmission peaks of the interferometric filter 223. The free spectral range (FSR) of the interferometric filter 223 may be the same as or at a sub-harmonic of the channel spacing of the multiplexer 221. For instance, for a multiplexer with about 100 GHz channel spacing, the FSR of the interferometric filter 223 may be about 100 GHz or about 50 GHz. The interferometric filter 223 may be a single stage etalon or a multiple stage etalon. A multiple stage etalon may provide better sharpness in terms of transmission spectral shape.

In an embodiment, the length of fiber between the laser transmitter 210 and the wavelength selective reflector 220 may range from less than about a few meters to a plurality of kilometers. In the case of relatively short fiber length, the laser transmitters 210 and the wavelength selective reflector 220 may be placed in the same location, e.g., a central office or building. In the case of relatively long fiber length, the laser transmitters 210 and the wavelength selective reflector 220 may be placed at different locations, e.g., different sites. For instance, a laser transmitter 210 may be placed at an ONU and the wavelength selective reflector 220 may be located at a remote node.

The light reflector 224 may be a FRM, which may comprise a second rotator 225 and a mirror 226. The mirror 226 may be fully reflective or partially reflective. Higher reflection provides less light loss and stronger feedback for self-seeding the laser 202, which is desirable. The mirror 226 may be coated with a band-pass coating that matches a desired wavelength band. Thus, the light reflector 224 may promote light transmissions in one wavelength band, such as the C-band (e.g., from about 1,529 nm to about 1,562 nm), and suppress transmissions at other wavelength bands. The second rotator 225 may be a Faraday rotator configured similar to the rotator 201 inside the laser transmitter 210. As such, the second rotator 225 may rotate an incoming light from the interferometric filter 223 and transmit the rotated light to the mirror 226. The second rotator 225 may also rotate the reflected light from the mirror 226 and transmit the rotated light to the interferometric filter 223. Thus, a light that passes twice through the second rotator 225, such as a reflected light in a round-trip path, may be rotated by about 90 degrees.

In the wavelength selective reflector 220, the multiplexer 221, coupler 222, interferometric filter 223, and light reflector 224 may be separate devices that are coupled to each other via fiber. Alternatively, these components may be integrated together. For example, the coupler 222, interferometric filter 223, and light reflector 224 may be integrated together, e.g., on a circuit or board.

In the colorless WDM transmitter configuration 200, each laser emitted light may pass through the rotator 201, undergo rotated polarization by about 45 degrees, and propagate to the multiplexer 221 through a fiber. Only the mode within the pass-band of the multiplexer 221 may be selected and passed into the coupler 222. The light from the output port of the coupler 222 corresponds to the transmitter output, while the light from the feedback port of the coupler 222 is sent into the interferometric filter 223. The transmission peak of the interferometric filter 223 may be matched in wavelength with the corresponding pass-band peak of the multiplexer 221 and the interferometric filter 223 may confine the spectrum of the selected mode. The output of the interferometric filter 223 may be sent into the light reflector 224 and reflected back with rotated polarization by about 90 or −90 degrees. The reflected light may be further confined in spectrum by the interferometric filter 223 and sent back to the rotator 201 inside the laser transmitter 210 on the same optical path. After another 45 degrees rotation in polarization by the rotator 201, the reflected light may enter back the laser 202 chip cavity to self-seed the light inside the cavity.

In the colorless WDM transmitter configuration 200, self-seeding may be achieved by the reflected light provided by the light reflector 224. Single mode (chip cavity mode) operation may be achieved via the wavelength selection of the multiplexer 221. The polarization between the reflected light and the light inside the laser cavity (of laser 202) may be aligned via the combination of the rotator 201 inside the laser transmitter 210 and the light reflector 224 (FRM), regardless of random or arbitrary birefringence that may exist in the fibers and components between the laser 202 and the light reflector 224. The relatively narrow band interferometric filter 221 (with respect to the multiplexer's band) may provide better confinement in the linewidth of the oscillated laser chip cavity mode (of laser 202), which may comprise a plurality of external cavity modes with mode spacing as low as Megahertz (MHz) to kilohertz (kHz) range, depending on the cavity length. The external cavity may correspond to the optical path between the laser 202 and the light reflector 224. The narrow filter bandwidth may also substantially reduce the requirement for the round trip loss of the external cavity, and thus significantly relieve the requirement for laser coupling loss and/or the insertion loss of the components inside the external cavity, including the multiplexer 221, coupler 222, interferometric filter 223, and light reflector 224. By placing a coupler 222 between the multiplexer 221 and the interferometric filter 223, the laser output may bypass the interferometric filter 223 and avoid the substantial filtering effect that may be caused by the relatively narrow band interferometric filter 223.

In other embodiments, the improved colorless WDM transmitter, which provides substantially narrow spectral linewidth without introducing substantial optical filtering effect, may be configured based on any configuration that uses self-seeding lasers or light sources, e.g. FPLDs and/or RSOAs. For instance, the improved colorless WDM transmitter system may be configured similar to any of the proposed WDM transmission systems/schemes described above, e.g., for WDM PONs. In any of the configurations above, the improved colorless WDM transmitter may comprise a self-seeding laser, a reflector that provides the self-seeding light to the laser, an interferometric filter that may be used for spectral purifying (narrowing linewidth), and a coupler that may be used to avoid substantial filtering effect (from the interferometric filter).

Figure 3:
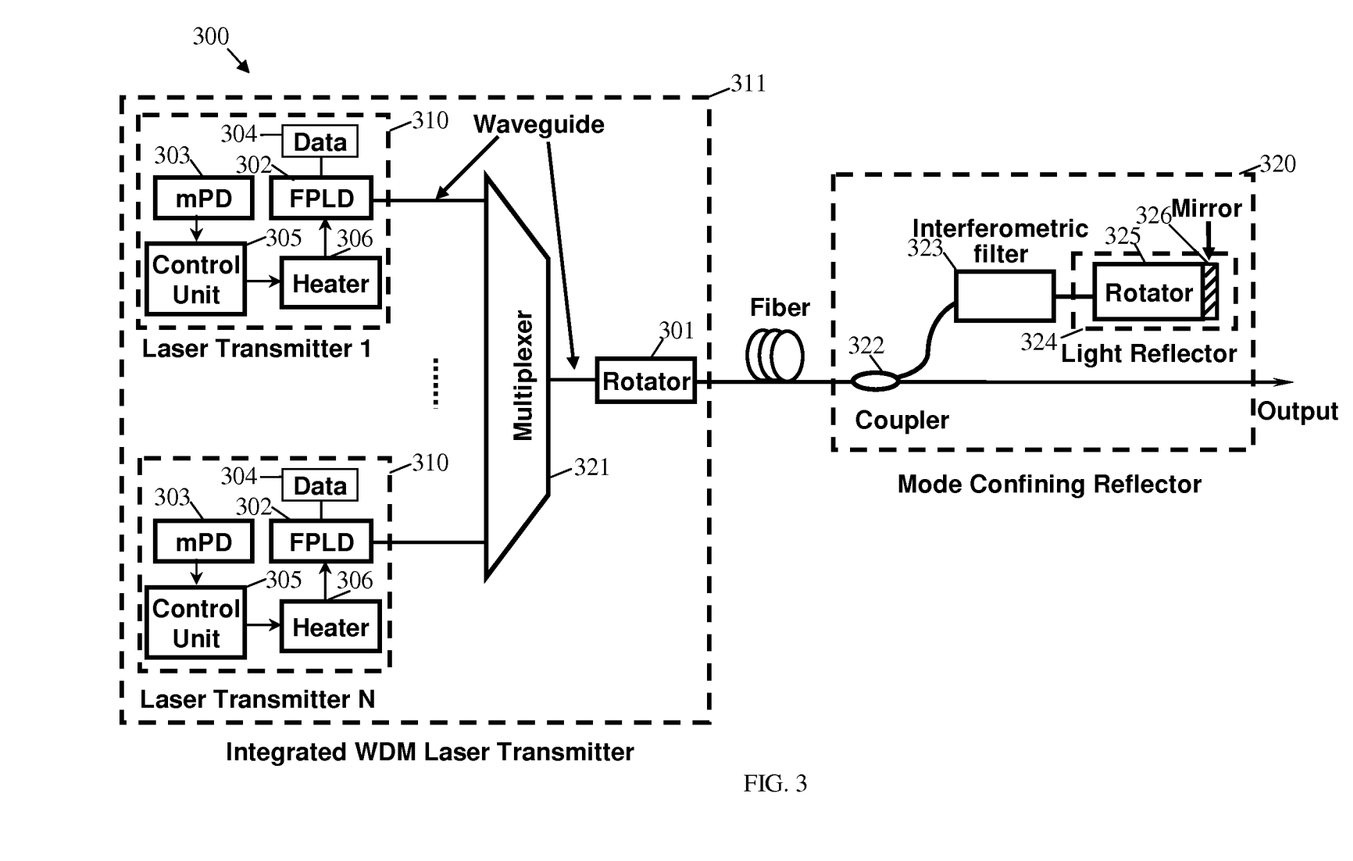
FIG. 3 is a schematic diagram of another embodiment of an improved colorless WDM transmitter configuration.

FIG. 3 illustrates an embodiment of another improved colorless WDM (or DWDM) transmitter configuration 300, which may allow narrowing the spectral linewidth of the transmitted light without introducing substantial optical filtering effect. The colorless WDM transmitter configuration 300 may comprise an integrated WDM laser transmitter 311 and a mode confining reflector 320 coupled to the integrated WDM laser transmitter 311 via a fiber. The integrated WDM laser transmitters 311 may comprise a plurality of laser transmitters 310 that may be coupled in parallel to a multiplexer 321. The integrated WDM laser transmitters 311 may also comprise a rotator 301 (e.g., a 45 or −45 degrees Faraday rotator) positioned between the multiplexer 321 and the mode confining reflector 320. The laser 302 may be coupled to a data unit 304 and a cooler/heater 306. The laser transmitter 310 may also comprise a detector 303 (e.g., mPD) coupled to the laser 302, and a control unit 305 positioned between the detector 303 and the cooler/heater 306. In some embodiments, the laser 302 and the multiplexer 321 may be coupled using at least one lens (not shown) positioned between the two components. Similarly, the laser 302 and the detector 303 may be coupled using one or more lenses (not shown) positioned between the two components.

The mode confining reflector 320 may comprise a coupler 322 coupled to the rotator 301, an interferometric filter 323 coupled to the coupler 322, and a light reflector 324 coupled to the interferometric filter 323. The light reflector 324 may be a FRM comprising a second rotator 325 and a mirror 326. The coupler 322 may be coupled to the rotator 301 via an output fiber coupled to a single port of the multiplexer 321. As shown in FIG. 3, the interferometric filter 323 and the light reflector 324 may be coupled via the coupler 322 to the rotator 301 in parallel to the output fiber. Hence, the lightpaths from the coupler 322 to the light reflector 324 and down onto the output fiber may be separated. The components of the colorless WDM transmitter configuration 300 may be arranged as shown in FIG. 3 and may be configured similar to the corresponding components of the colorless WDM transmitter configuration 200.

In the colorless WDM transmitter configuration 300, the laser transmitters 310, the multiplexer 321, and possibly the rotator 301 may be integrated together (in the integrated WDM laser transmitter 311). The integration may be in the form of monolithic integration or hybrid integration. For hybrid integration, a silica-on-silicon planar lightwave circuit (PLC) may be used as a bench to mount laser chips (e.g., Indium phosphide (InP) laser chips) and the multiplexer may be made of silica-on-silicon PLC. As such, the passive waveguides of the PLC may be optically coupled to the active InP waveguides, such as laser diodes, as described in U.S. Patent Application No. 2008/0080866 filed Aug. 24, 2007 by Yu Sheng Bai et al. and entitled "Method and system for integrated DWDM transmitters," which is incorporated herein by reference as if reproduced in its entirety. In this scheme, the multiple laser chips may be in the form of one or multiple laser array chips. The laser array chips may be mounted next to the input ports of the multiplexer 301, using p-side down, flip-chip method, to facilitate the optical alignment between the laser transmitters 310 and corresponding multiplexer input waveguides. Preferably, the output ports of the laser chips may have mode converters to reduce coupling loss between the lasers 302 and corresponding waveguides.

The laser transmitters 310 may be similarly configured to transmit light at a wavelength range. For each laser transmitter 310, a detector 303 may be coupled to the back facet of the corresponding laser 302 to detect the backward light and the output of the detector may be sent to the control unit 305 to control the temperature of the laser 302 via a heater/cooler 306. This temperature control may be used to lock and stabilize the oscillated wavelength in the laser 302. Each laser 302 may be directly modulated by the corresponding data unit 304, separately from the remaining laser transmitters 310. The output of each laser transmitter 310 may be coupled into an input port of the multiplexer 321 and may be wavelength selected and combined with other channels. The output of the multiplexer 321 may be coupled into the rotator 301, which may be shared by all the channels. The output of the rotator 301 may be sent to the mode confining reflector 320 via a segment of fiber.

Since the laser transmitters 310 and the multiplexer 321 are integrated together, the polarization of the light from the laser transmitters 310 to the output port of the multiplexer 321 may be maintained and stable. Any polarization perturbation due to birefringence between the output port of the multiplexer 321 and the mode confining reflector 320 may be eliminated via the combination of the light reflector 324 (FRM) and the rotator 301 connected to the multiplexer. Similar to the colorless WDM transmitter configuration 200, self-seeding may be achieved in the colorless WDM transmitter configuration 300 by the reflected light provided by the light reflector 324, and single mode operation may be realized via the wavelength selection of the multiplexer 321.

The integration of the laser transmitters 310 with the multiplexer 321 may eliminate individual packaging requirement of laser transmitters 310, which may contribute a significant part of system cost. Furthermore, this scheme may require a single rotator (rotator 301) for polarization alignment that may be shared by all the channels, e.g., instead of using a rotator for each laser. Thus, the integration of laser transmitters 310 with the multiplexer 321 may significantly reduce the cost of the colorless WDM transmitter system. This integration scheme may be applied to any configuration that uses self-seeding lasers, e.g. FPLDs and/or RSOAs. For instance, the WDM transmitter system may be configured similar to any of the proposed transmission scheme/systems described above for WDM PONs. Accordingly, the improved colorless WDM transmitter may comprise a self-seeding laser, a reflector that provides the self-seeding light to the laser, an interferometric filter that may be used for spectral purifying (narrowing linewidth), and a coupler that may be used to avoid substantial filtering effect (from the interferometric filter).

Figure 4:
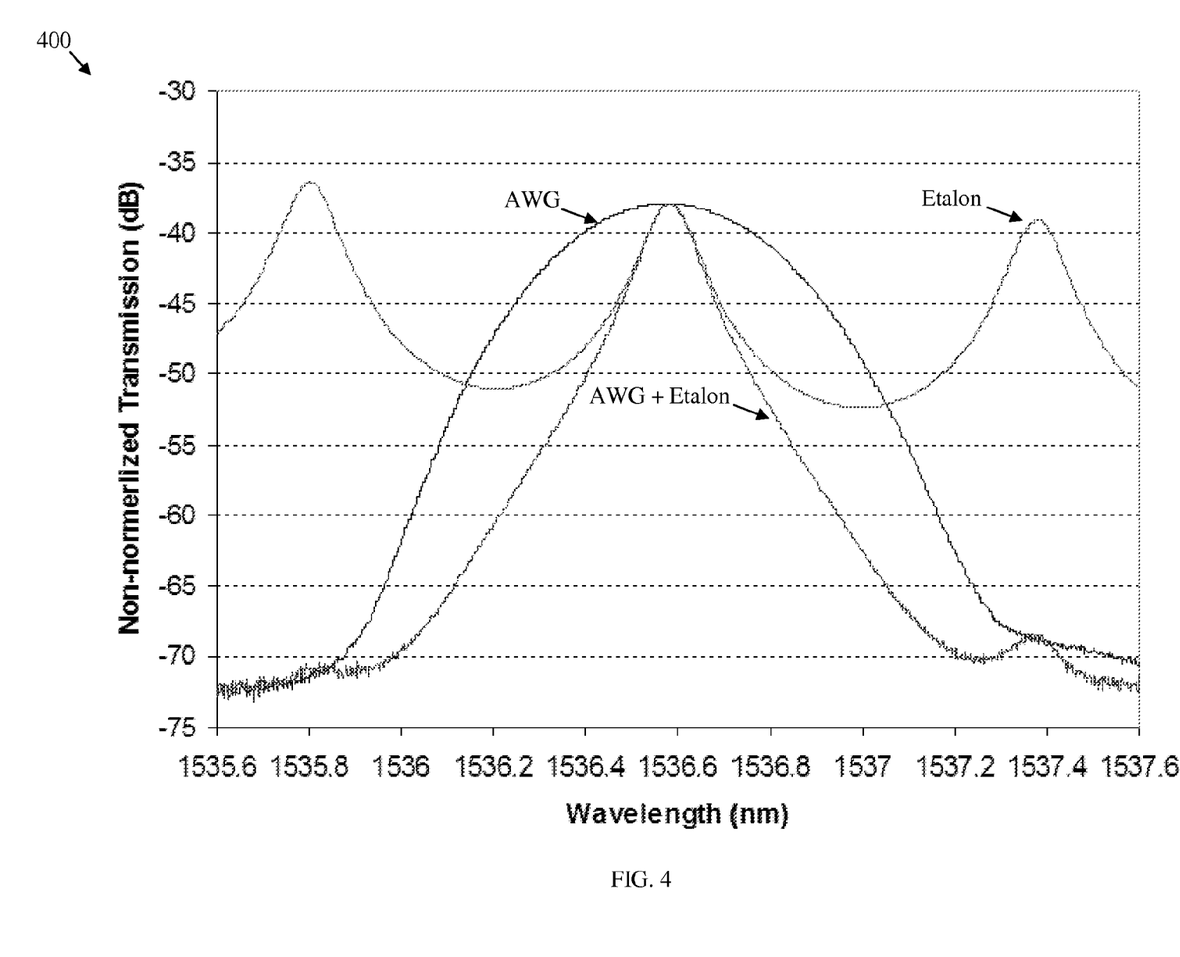
FIG. 4 is a chart of a filter transmission profile of a colorless WDM transmitter.

The improvement in signal quality of the transmitter output via the introduction of an interferometric filter and coupler (as shown in the schemes above) has been verified via experiment. In one experiment, an AWG that has about 100 GHz channel spacing was used as the WDM multiplexer, and a Fabry-Perot etalon that has about 100 GHz FSR was used as the interferometric filter. FIG. 4 illustrates an embodiment of a transmission profile 400 of combined multiplexer and interferometric filter for such colorless WDM transmitter setup. Specifically, the chart in FIG. 4 illustrates the filter transmission profiles of both the AWG and the etalon individually, and the profile of the combination of the AWG and the etalon. The uneven peaks in the measured etalon transmission profile are due to the non-flat profile of amplified emission noise that was used as the broadband source. The about 3 dB bandwidth of the AWG and etalon combination may be substantially determined by the bandwidth of the etalon, since the etalon bandwidth is substantially narrower than that of the AWG. Thus, the effective filter bandwidth may be significantly reduced when the etalon is introduced into the external cavity. This narrower filter bandwidth may better confine the spectrum of the oscillated mode and relieve the requirement for laser coupling loss and the insertion loss of components inside the external cavity.

Figure 5:
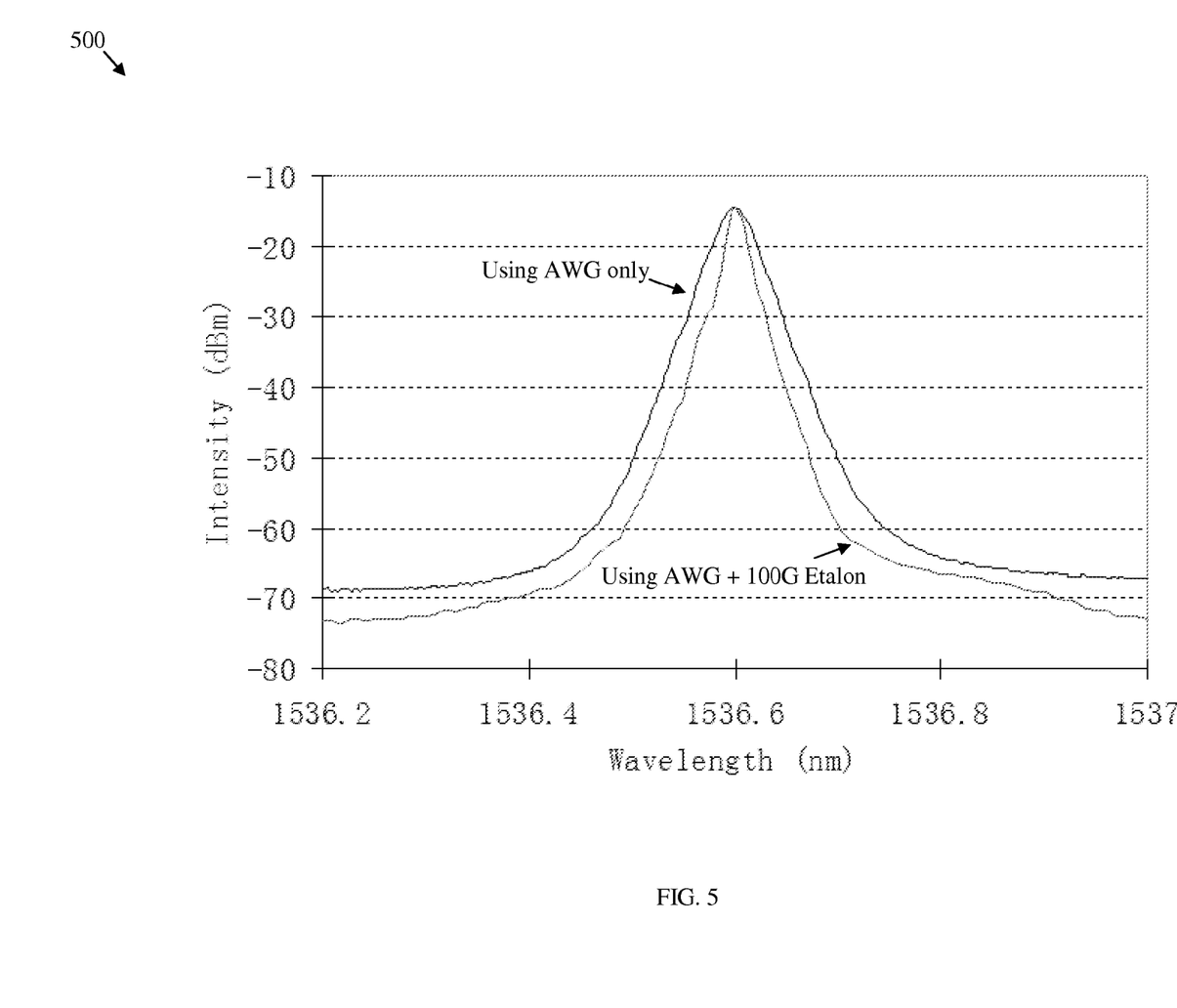
FIG. 5 is a chart of optical spectra of a colorless WDM transmitter.

FIG. 5 illustrates another embodiment of the optical spectra 500 of a colorless WDM transmitter. Specifically, the chart in FIG. 5 illustrates the optical spectra of directly modulated laser under self-seeding with different filter bandwidths. Both cases of using only the AWG and using the AWG and etalon combination are shown for comparison. For both cases, single mode operation may be achieved, where only the selected mode is oscillated and enhanced in intensity, while other laser chip cavity modes are suppressed. When only AWG is used for wavelength selection, the spectral linewidth of the oscillated mode is relatively broad and the noise floor is relatively high. However, when an etalon is added into the external cavity and located between the coupler 222 and light reflector 224, the spectral linewidth of the oscillated mode is substantially reduced, and the noise floor is also lowered. This narrower linewidth may lead to larger tolerance to fiber dispersion and provide better transmission performance for the colorless WDM transmitters.

Figure 6:
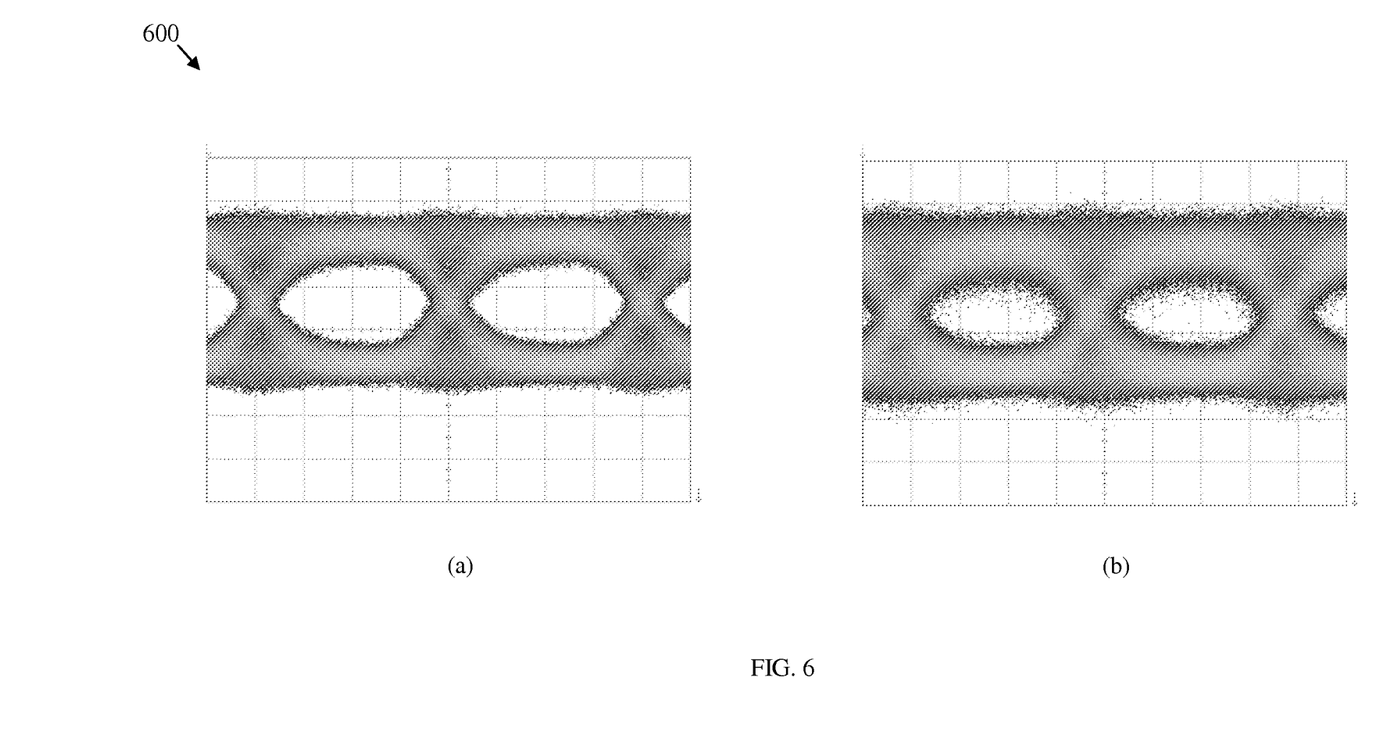
FIG. 6 is a chart of an eye diagram of a colorless WDM transmitter.

Typically, direct modulation of a semiconductor laser may induce frequency chirp and broaden the optical spectrum, e.g., even under self-seeding. If the output passes through the narrow band etalon, the output may suffer from strong filtering effect, which may degrade the signal quality. However, by placing a coupler between the multiplexer and the etalon, the output of the self-seeded signal may be bypassed from the etalon, and relatively strong optical filtering may be avoided. FIG. 6 illustrates an embodiment of an eye diagram 400 of a colorless WDM transmitter. Specifically, FIG. 6 shows eye diagrams of a self-seeded laser where the coupler is located at different positions. The eye diagrams correspond to two scenarios. In a first scenario, scenario (a), the coupler is located between the multiplexer and the etalon. In a second scenario, scenario (b), the coupler is located between the etalon and the light reflector. When the coupler is placed between the multiplexer and the etalon (scenario (a)), the output has a relatively clean eye diagram. However, when the coupler is located between the etalon and the light reflector (scenario (b)), the eye becomes blurred, with reduced eye opening. The degraded eye quality may be due to relatively strong filtering effect when the transmitter output passes through the etalon that has a relatively or substantially narrow bandwidth.

Figure 7:
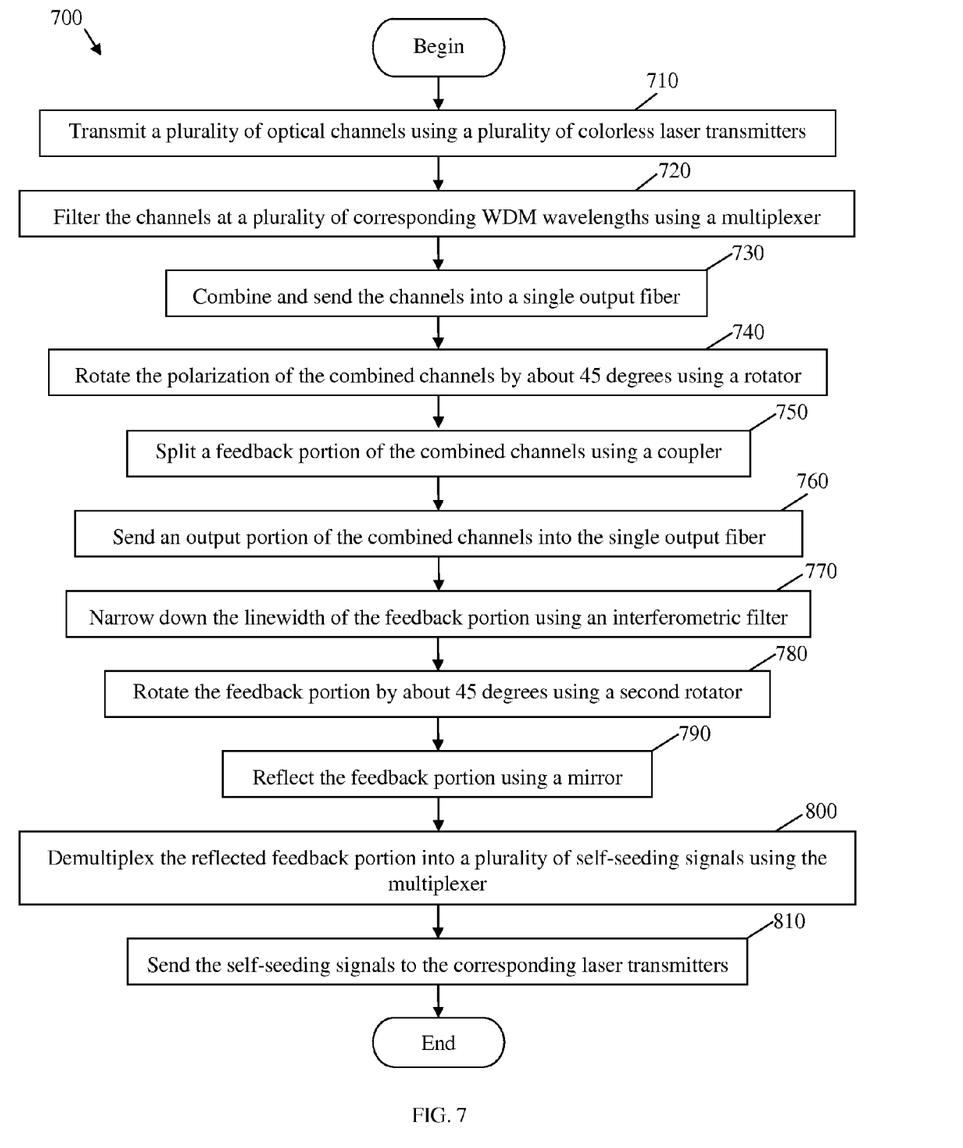
FIG. 7 is a flowchart of an improved embodiment of a colorless WDM transmitter method.

FIG. 7 illustrates an embodiment of a colorless WDM transmitter method 700, which may be implemented to provide improved performance and reduced cost. For instance, the method 700 may be implemented using the colorless WDM transmitter configuration 200 or the colorless WDM transmitter configuration 300, e.g., to narrow the spectral linewidth of the transmitted light without introducing substantial optical filtering effect. The method 700 may begin at block 710, where a plurality of optical channels may be transmitted using a plurality of colorless laser transmitters. At block 720, the channels may be filtered at a plurality of WDM (or DWDM) wavelengths using a multiplexer. At block 730, the channels may be combined and sent into a single output fiber. At block 740, the polarization of the combined channels may be rotated by about 45 degrees using a rotator, such as in the colorless WDM transmitter configuration 300. Alternatively, the polarization of each of the channels may be rotated by about 45 degrees using a corresponding rotator in each of the laser transmitters, such as in the colorless WDM transmitter configuration 200.

At block 750, a feedback portion of the combined channels may be split using a coupler. At block 760, an output portion of the combined channels may be sent into the single output fiber. At block 770, the linewidth of the feedback portion may be narrowed down using an interferometric filter. At block 780, the feedback portion may be rotated by about 45 degrees using a second rotator. At block 790, the feedback portion may be reflected using a mirror, At block 800, the reflected feedback portion may be demultiplexed into a plurality of self-seeding signals using the multiplexer. At block 810, the self-seeding signals may be sent to the corresponding laser transmitters. The method 700 may then end.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 7 percent, . . . , 70 percent, 71 percent, 72 percent, . . . , 97 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A dense wavelength-division-multiplexing (DWDM) system, comprising:
   a plurality of laser transmitters;
   a wavelength division multiplexer (WDM) optically coupled to the laser transmitters and to an output optical transmission media;
   a coupler optically coupled to the output optical transmission media;
   an interferometric filter optically coupled to the coupler but not directly to the output optical transmission media; and a light reflector optically coupled to the interferometric filter and not directly to the output optical transmission media.

2. The system of claim 1, wherein each of the laser transmitters comprises:
a self-seeding laser;
a data unit coupled to the self-seeding laser;
a detector coupled to the self-seeding laser;
a laser wavelength control unit coupled to the detector; and
a laser cooler/heater coupled to the self-seeding laser.

3. The system of claim 2, wherein each of the laser transmitters further comprises a rotator positioned between the self-seeding laser and the WDM.

4. The system of claim 3, wherein the WDM, the coupler, the interferometric filter, and the light reflector are integrated onto a single component.

5. The system of claim 2 further comprising a rotator positioned between the WDM and the coupler.

6. The system of claim 2, wherein the laser transmitters and the WDM are integrated onto a planar lightwave circuit (PLC), and wherein the coupler, the interferometric filter, and the light reflector are integrated onto a single component.

7. The system of claim 2, wherein the self-seeding lasers are colorless lasers that transmit a plurality of signals at about the same wavelength range, and wherein the WDM is configured to select a plurality of WDM wavelengths that provide a plurality of wavelength channels from the signals.

8. The system of claim 2, wherein the self-seeding laser is a Self-seeding Fabry-Perot laser diodes (FPLD).

9. The system of claim 2, wherein the self-seeding laser is a reflective semiconductor optical amplifier (RSOA).

10. The system of claim 2, wherein the self-seeding laser has a cavity mode spacing that is greater than that of the channel spacing of the WDM, and wherein the combination of the WDM and the interferometric filter has a bandwidth that is substantially less than the cavity mode spacing.

11. The system of claim 1, wherein the light reflector is a Faraday Rotator Mirror (FRM) that comprises a mirror and a second rotator positioned between the mirror and the interferometric filter.

12. The system of claim 1, wherein the interferometric filter has a substantially narrower bandwidth than the WDM and is configured to narrow the linewidth of an output light from the WDM.

13. The system of claim 1, wherein the coupler allows a portion of an output light from the WDM in the output optical transmission media to bypass the interferometric filter and avoid any substantial filtering effect from the interferometric filter.

14. The system of claim 1, wherein the WDM is an arrayed waveguide grating (AWG), an optical interleaver, a fiber Bragg grating multiplexer, an optical add-drop multiplexer (OADM), or a reconfigurable OADM (ROADM).

15. The system of claim 1, wherein the interferometric filter has a free spectral range (FSR) that is the same as or at a sub-harmonic of a channel spacing of the multiplexer.

16. The system of claim 15, wherein the multiplexer has about 100 Gigahertz (GHz) channel spacing, and wherein the FSR of the interferometric filter is about 100 GHz or about 50 GHz.

17. The system of claim 1, wherein the optical transmission media comprises an optical waveguide.

18. The system of claim 17, wherein the optical waveguide comprises a fiber.

19. A method implemented by a colorless wavelength division multiplexing laser transmitter apparatus comprising:

transmitting a plurality of optical channels using a plurality of colorless laser transmitters;
combining and sending the optical channels into a single output optical transmission media;
splitting a feedback portion of the combined channels;
narrowing the linewidth of the feedback portion using an interferometric filter;
reflecting the feedback portion;
demultiplexing the reflected feedback portion into a plurality of self-seeding signals using the multiplexer; and
sending the self-seeding signals to the corresponding laser transmitters.

20. The method of claim 19, further comprising:
filtering the channels at a plurality of corresponding dense wavelength-division-multiplexing (DWDM) wavelengths using a multiplexer.

21. The method of claim 20, further comprising:
sending an output portion of the combined channels into the single output optical transmission media.

22. The method of claim 19 further comprising:
rotating a polarization of each of the optical channels by about 45 degrees using a plurality of first rotators in the corresponding colorless laser transmitters;
rotating a polarization of the feedback portion from the interferometric filter by about 45 degrees using a second rotator;
rotating a polarization of the reflected feedback portion from the mirror by about 45 degrees using the second rotator; and
rotating a polarization of each of the self-seeding signals by about 45 degrees using the first rotators in the corresponding colorless laser transmitters.

23. The method of claim 19 further comprising:
detecting a backward light transmitted from each of the colorless laser transmitters;
converting the detected backward light into a photocurrent;
determining based on the photocurrent a shift between an oscillated wavelength of the backward light and a determined transmission peak for the combination of the multiplexer and the interferometric filter; and
compensating for the shift by controlling the temperature of each of the colorless laser transmitters.

24. A method implemented by a colorless wavelength division multiplexing laser transmitter apparatus comprising:
transmitting a plurality of optical channels using a plurality of colorless laser transmitters;
combining and sending the optical channels into a single output optical transmission media;
splitting a feedback portion of the combined channels;
narrowing the linewidth of the feedback portion using an interferometric filter;
reflecting the feedback portion;
demultiplexing the reflected feedback portion into a plurality of self-seeding signals using the multiplexer;
sending the self-seeding signals to the corresponding laser transmitters;
rotating a polarization of the combined channels from the multiplexer by about 45 degrees using a first rotator;
rotating a polarization of the feedback portion from the interferometric filter by about 45 degrees using a second rotator;
rotating a polarization the reflected feedback portion from the mirror by about 45 degrees using the second rotator; and further rotating the polarization of the reflected feedback portion by about 45 degrees using the first rotator before demultiplexing the reflected feedback portion using the multiplexer.

* * * * *